(12) United States Patent
Kuan

(10) Patent No.: US 9,185,814 B2
(45) Date of Patent: Nov. 10, 2015

(54) ELECTRONIC DEVICE WITH ROTATION MECHANISM

(71) Applicant: HON HAI PRECISION INDUSTRY CO., LTD., New Taipei (TW)

(72) Inventor: Chang-Ming Kuan, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 259 days.

(21) Appl. No.: 13/972,942

(22) Filed: Aug. 22, 2013

(65) Prior Publication Data

US 2014/0055930 A1 Feb. 27, 2014

(30) Foreign Application Priority Data

Aug. 24, 2012 (TW) .............................. 101130904 A

(51) Int. Cl.
*G06F 1/16* (2006.01)
*H05K 5/02* (2006.01)
*H04M 1/02* (2006.01)

(52) U.S. Cl.
CPC ........... *H05K 5/0221* (2013.01); *H04M 1/0202* (2013.01); *H04M 1/0227* (2013.01)

(58) Field of Classification Search
CPC ...... G06F 1/162; G06F 1/1624; H05K 5/0221
USPC ...................................................... 361/679.02
See application file for complete search history.

(56) References Cited

U.S. PATENT DOCUMENTS

| | | | |
|---|---|---|---|
| 7,798,457 B2 * | 9/2010 | Chih et al. | 248/284.1 |
| 7,916,467 B2 * | 3/2011 | Hotelling et al. | 361/679.41 |
| 8,255,021 B2 * | 8/2012 | Liang | 455/575.4 |
| 8,587,933 B2 * | 11/2013 | Ho et al. | 361/679.01 |
| 8,634,191 B2 * | 1/2014 | Tang et al. | 361/679.57 |
| 8,995,116 B2 * | 3/2015 | Hung et al. | 361/679.26 |
| 2008/0055829 A1 * | 3/2008 | Ko et al. | 361/681 |
| 2015/0122851 A1 * | 5/2015 | Mulhern et al. | 224/191 |

* cited by examiner

*Primary Examiner* — Anthony Q Edwards
(74) *Attorney, Agent, or Firm* — Novak Druce Connolly Bove + Quigg LLP

(57) ABSTRACT

An electronic device uses a rotation mechanism to permit a first body casing to rotate on a second body casing. The rotation mechanism has an elastic member and a sliding block. The first body casing includes a spindle and defines a first sliding hole and the second body casing defines a spindle hole and a second sliding hole. The second sliding hole includes a first distal end and a second distal end both aligning with a center of the spindle hole. The sliding block is movably received in the first and second sliding holes, and is located either at the first distal end or at the second distal end as the rotation mechanism is rotated through ninety degrees from one position to another.

20 Claims, 12 Drawing Sheets

ELECTRONIC DEVICE WITH ROTATION MECHANISM

BACKGROUND

1. Technical Field

The present disclosure generally relates to electronic devices having hinged parts.

2. Description of Related Art

Many electronic devices include hinged parts, where the electronic devices use a rotation mechanism to rotate a part of the electronic devices. However, most types of rotation mechanisms used in the electronic devices have a complex structure, and the rotation mechanisms may be costly.

What is needed, therefore, is a means which can overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Reference will be made to the drawings to describe various embodiments.

Figure 1:
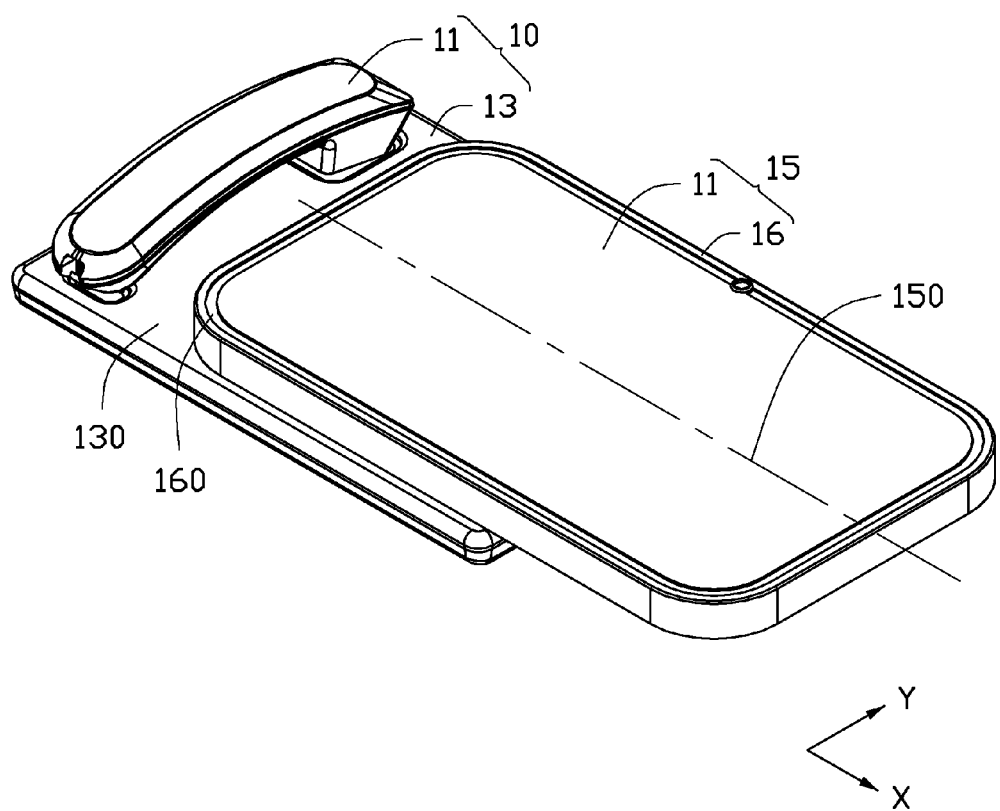
FIG. 1 is an isometric view of an electronic device according to an exemplary embodiment of the disclosure, where the electronic device includes a first body, a second body, and a rotation mechanism, and showing the electronic device in a first state.
Figure 2:
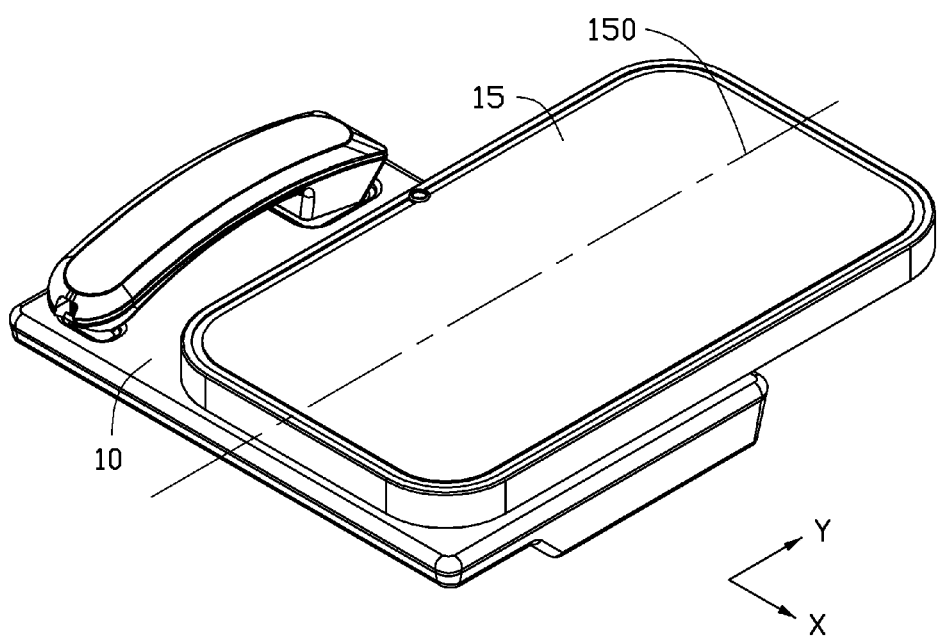
FIG. 2 is similar to FIG. 1, but showing the electronic device in a second state.
Figure 3:
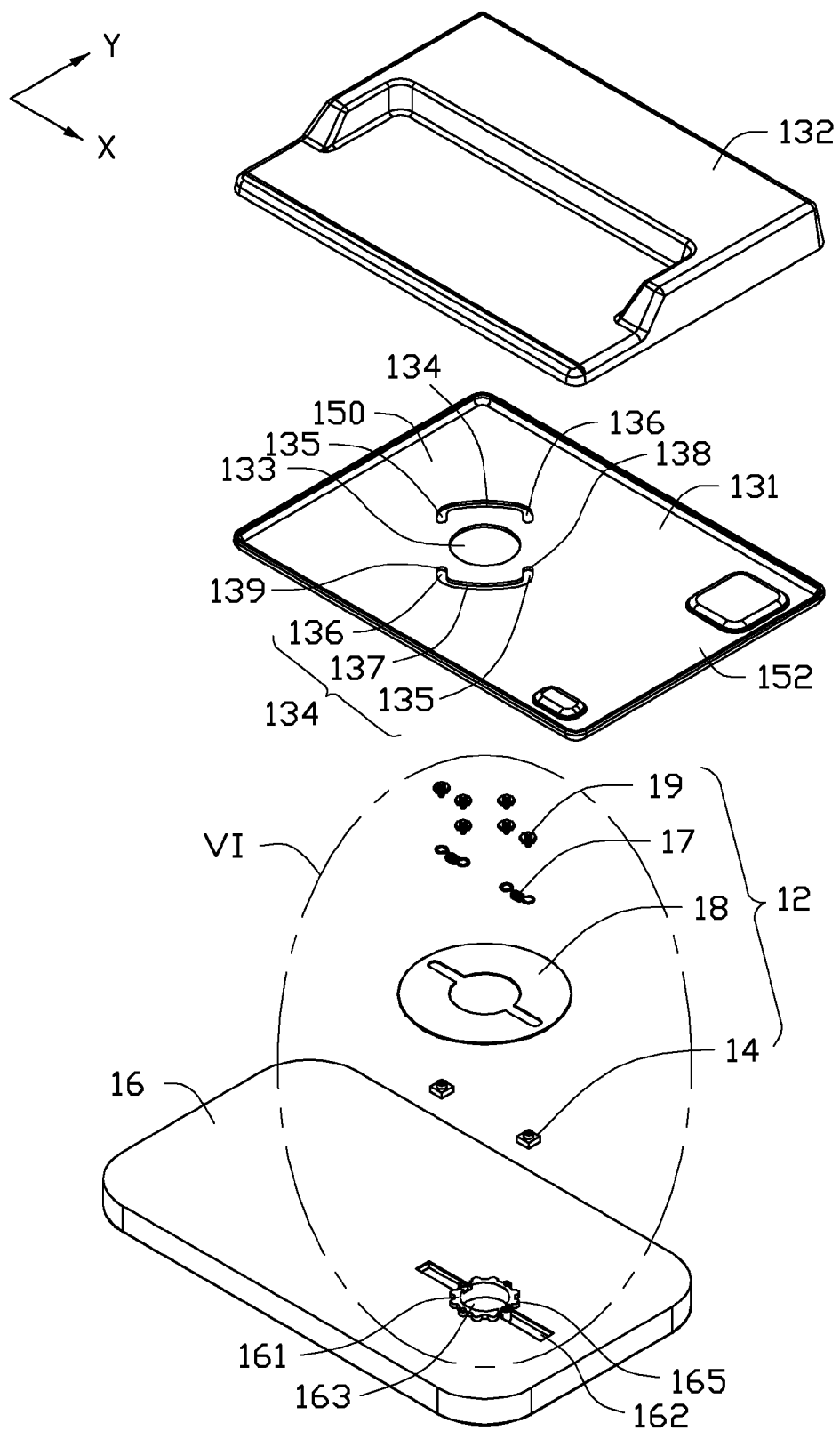
FIG. 3 is and exploded and isometric view of the electronic device of FIG. 1, the second body includes a top cover.

Referring to FIGS. 1-3, in one embodiment, an electronic device 1 includes a first body 15, a second body 10, and a rotation mechanism 12 connecting the first body 15 to the second body 10. The first body 15 is rotatable relative to the second body 10. The electronic device 1 can be rotated to be in a first state (see FIG. 1) or a second state (see FIG. 2). When the electronic device 1 is in the first state, a long axis 150 of the first body 15 is rotated parallel to a first direction, and the first direction is a direction parallel to an X-axis as shown in FIG. 1. When the electronic device 1 is in the second state, the long axis 150 of the first body 15 is rotated parallel to a second direction perpendicular to the first direction, and the second direction is a direction parallel to a Y-axis as shown in FIG. 1.

The electronic device 1 may for example be a telephone, where the first body 15 and the second body 10 may be a display module and a main body of the telephone, respectively of the telephone.

The first body 15 includes a first casing 16 and a display panel 11 configured to display images and text messages. The first casing 16 defines a first receiving space 160 at a front side of the first casing 16 to receive the display screen 11. The first casing 16 includes a spindle 161 extending from a rear side of the first casing 16 towards the second body 10. The spindle 161 further includes a plurality of semicircular protrusions 165 extending from circumference of the spindle 161. The spindle 161 defines a receiving hole 163 to allow wires, which electrically interconnect the display panel 11 and the telephone set 13 to pass through, and the receiving hole 163 is coaxial with the spindle 161. The first casing 16 defines two first sliding holes 162 at opposite sides of the spindle 161, the first sliding holes 162 extending along a direction parallel to the long axis 150 of first body 15, and the first sliding holes 162 communicate with the first receiving space 160 and connect the spindle 161.

The second body 10 includes a handset (not labeled) and a telephone set 13. The telephone set 13 may be placed on a flat surface, such as a surface of a desk, and the handset is arranged on the telephone set 13. The handset can be picked up from the telephone set 13 and replaced on the telephone set 13.

The telephone set 13 includes a second casing 130. The second casing 130 includes a top cover 131 and a bottom cover 132, the top cover 131 and the bottom cover 132 cooperate to define a second receiving space to receive interior electronic elements and circuits of the telephone set 13. The top cover 131 includes a first holding part 152 for holding the handset and a second holding part 150 for holding the display module 15. The top cover 131 defines a first through hole 133 corresponding to the spindle 161 of the first casing 16 and two second sliding holes 134 symmetrically arranged outside of the first through hole 133.

Figure 4:
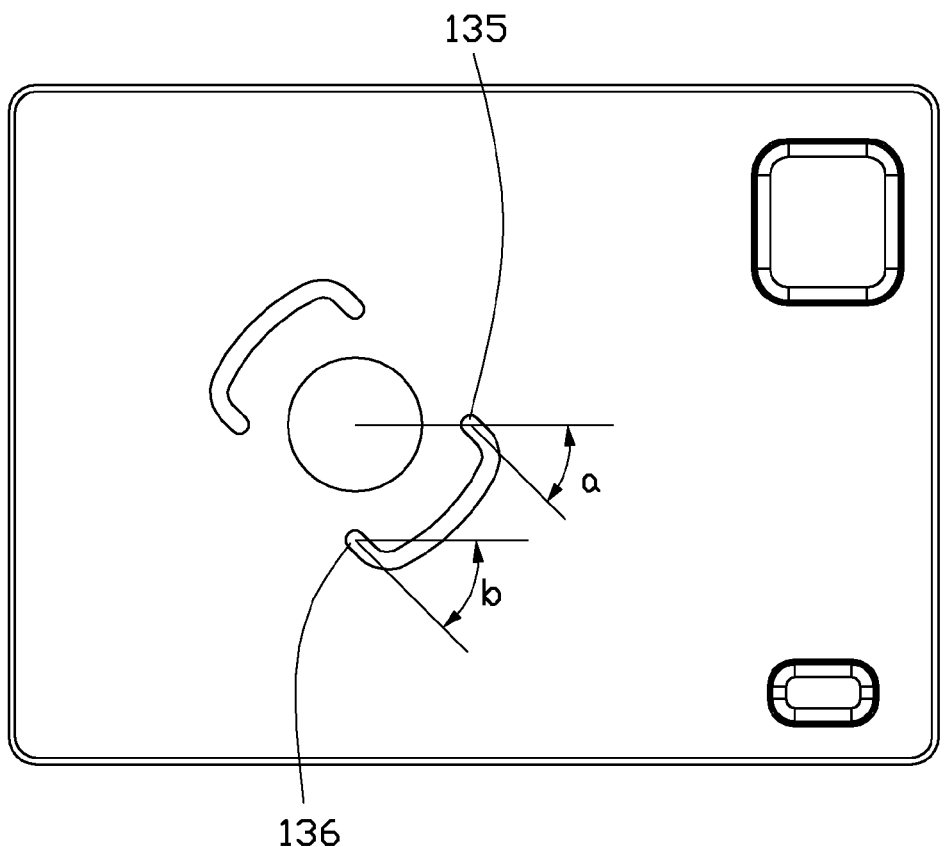
FIG. 4 is a plan view of the top cover of the electronic device of FIG. 3.
Figure 5:
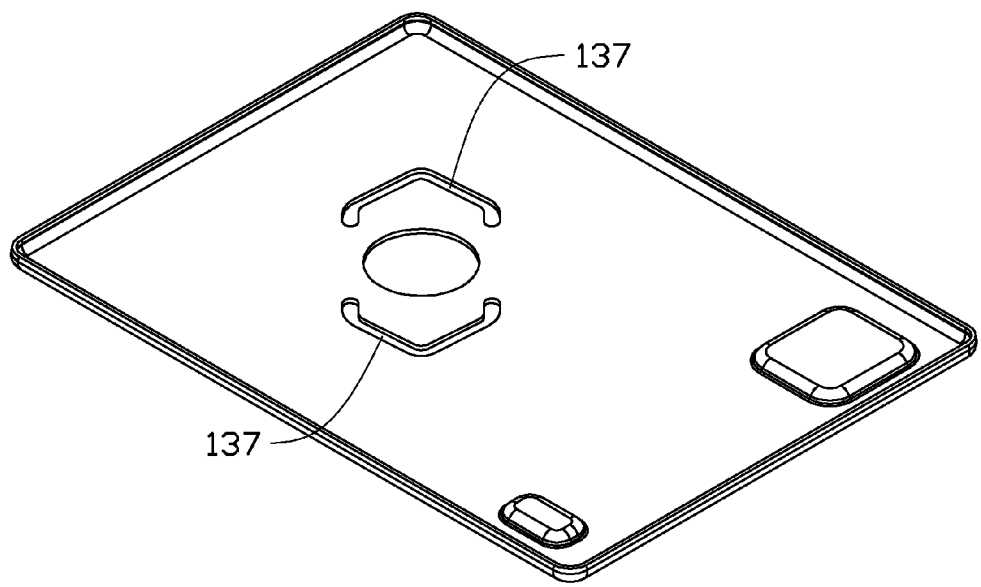
FIG. 5 is a plan view of the top cover of the electronic device according to alternative embodiment of FIG. 4.

Each second sliding hole 134 includes a first portion 135, a second portion 136, and a connection portion 137 interconnecting the first and second portions 135, 136. The first portion 135 includes a first distal end 138, and the second portion 136 includes a second distal end 139. A connecting line between a center of the first through hole 133 and the first distal end 138 is parallel to the first direction. A connecting line between the center of the first through hole 133 and the second distal end 139 is parallel to the second direction. An extending direction of the first portion 135 is oblique to the first direction and forms a first angle a. An extending direction of the second portion 136 is oblique to the first direction and forms a second angle b. In this embodiment, the first angle and the second angle are both forty-five degrees (see FIG. 4). Angles of the first and second angles herein are not limited to those in the above-described embodiment, and the angles of the first and second angles can be configured according to particular requirements, for example, the first and second angles can also be thirty degrees. Alternatively, the first angle and the second angle can also be different, for example, the first angle is thirty degrees, and the second angle is forty-five degrees. The connecting portion 137 can be arc-shaped (see FIG. 4). Alternatively, the connecting portion 137 can also be a bent line (see FIG. 5).

The rotation mechanism 12 includes two sliding blocks 14, a flat washer 18, two elastic members 17, and a plurality of fixing members 19.

Figure 6:
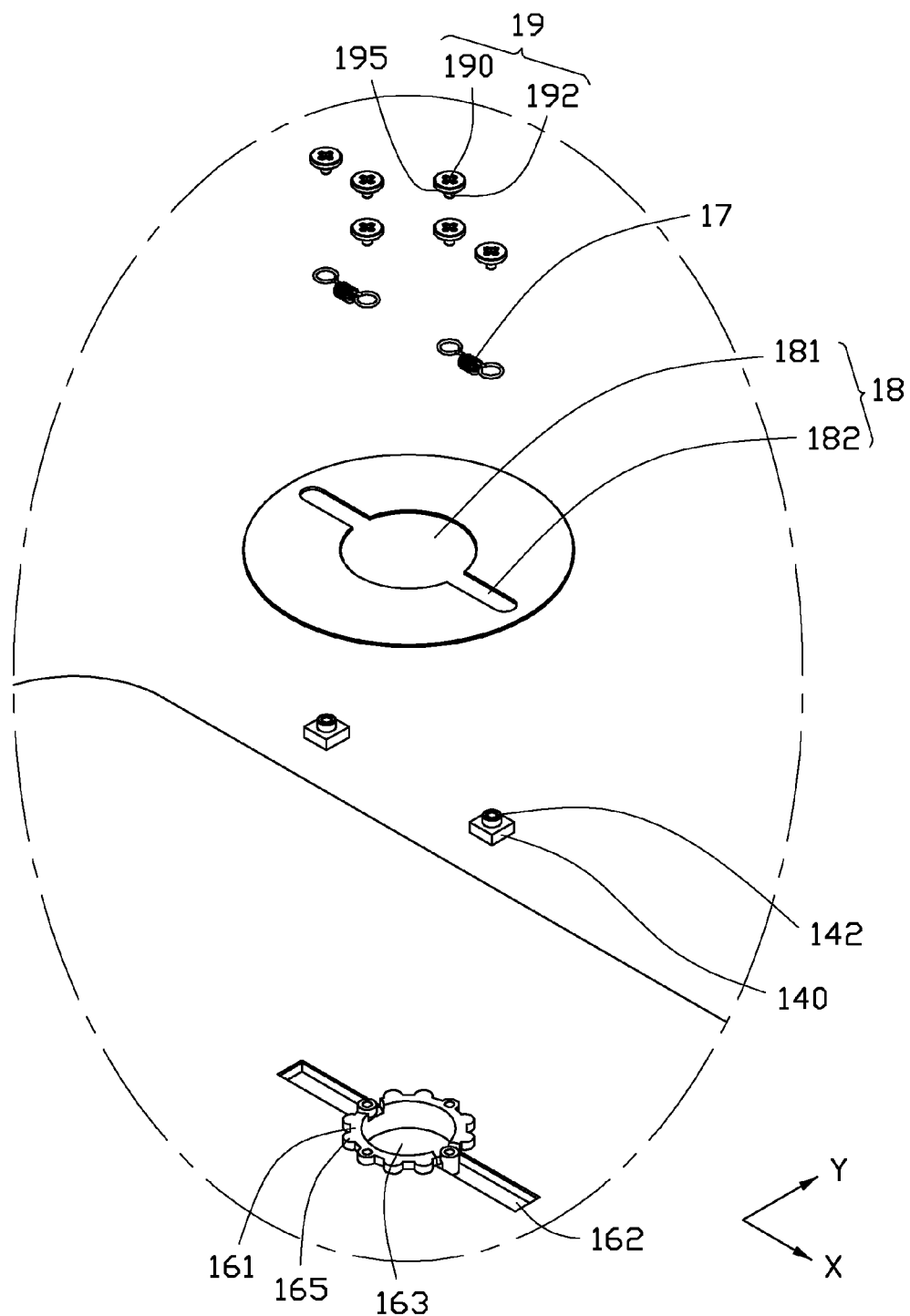
FIG. 6 is an enlarged and isometric view of a circled portion VI of the rotation mechanism of FIG. 3.

Referring also to FIG. 6, each sliding block 14 includes a base body 140 and a limiting pole 142 extending from the base body 140 towards the telephone set 13. The base bodies 140 of the sliding blocks 14 are movably received in the first receiving space 160 of the first casing 16. The limiting poles 142 of the sliding blocks 14 pass through the first sliding holes 162, and can move back and forth in the first sliding holes 162 along a direction parallel to the long axis 150.

The flat washer 18 defines a second through hole 181 corresponding to the spindle 161 and two third sliding holes 182 at opposite sides of the second through hole 181. The third sliding holes 182 extend along a direction parallel to the long axis 150 of the first casing 16 and communicate with the second through hole 181.

The elastic members 17 are received in the first sliding holes 162. Each elastic member 17 connects one sliding block 14 to the spindle 161, and exerts a resilient force to the sliding block 14 when the sliding block 14 moves back and forth along the direction parallel to the long axis 150.

Each fixing member 19 includes a head 190 and a fixing pole 192 connecting with the head 190. The head 190 has a greater diameter than a diameter of the fixing pole 192, and the fixing pole 192 extends from a first stopper surface 195 of the head 190.

Figure 7:
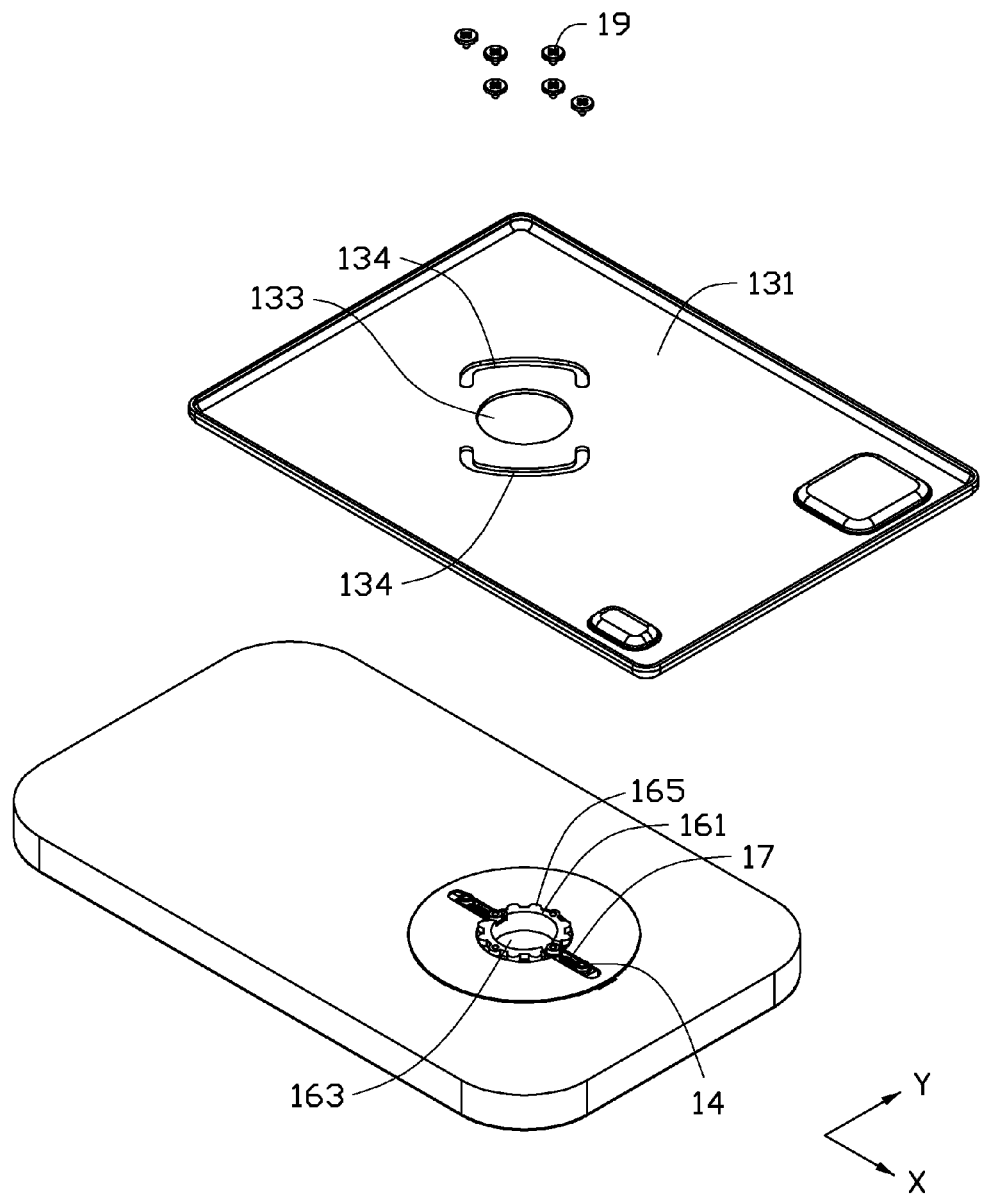
FIGS. 7-8 shows an assembled view of the top cover of the second body, the rotation mechanism, and the first body.
Figure 8:
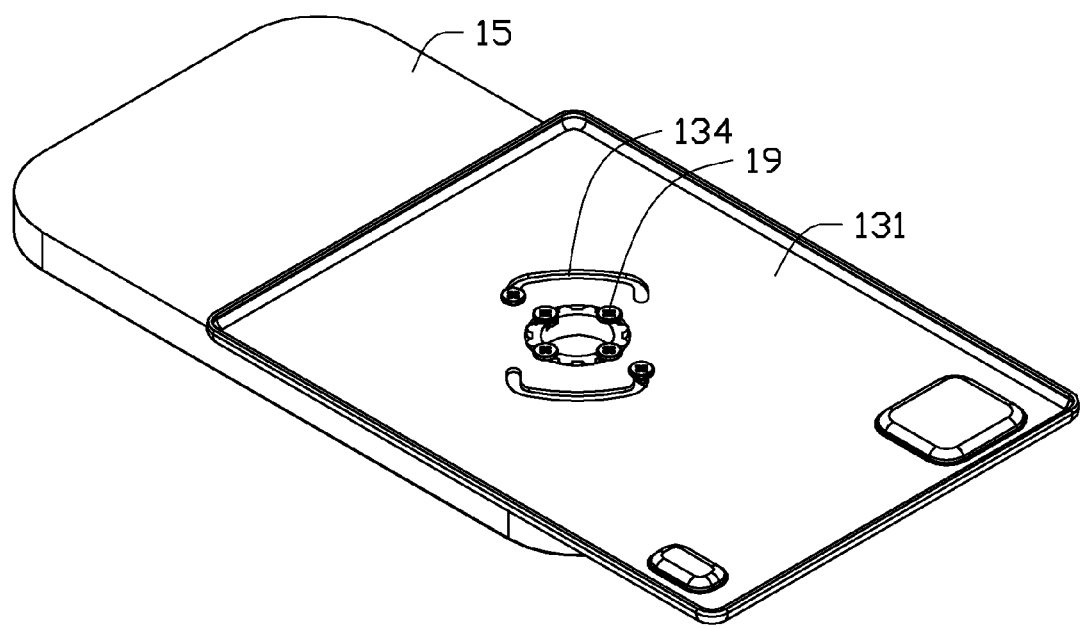
Figure 9:
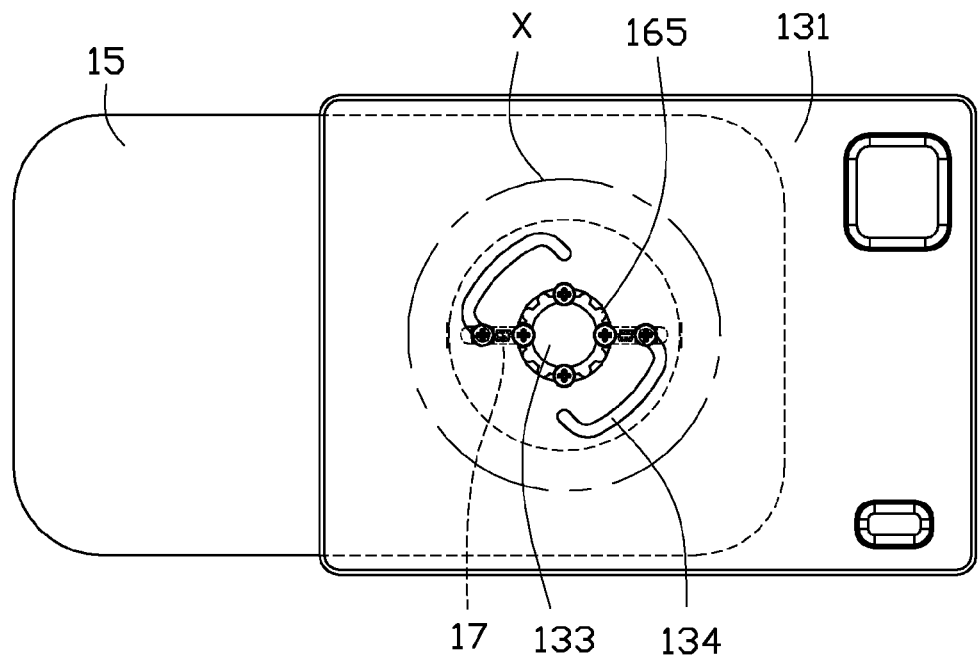
FIG. 9-10 show plan views of the electronic device of FIG. 8 in the first state.
Figure 10:
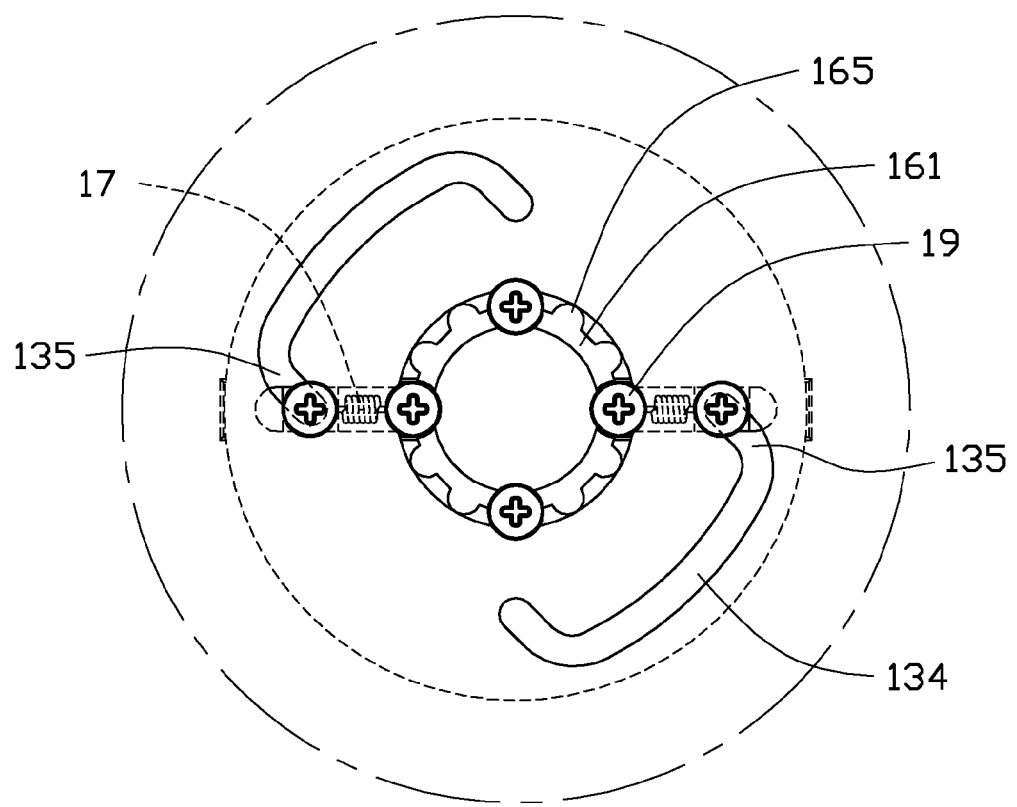
Figure 11:
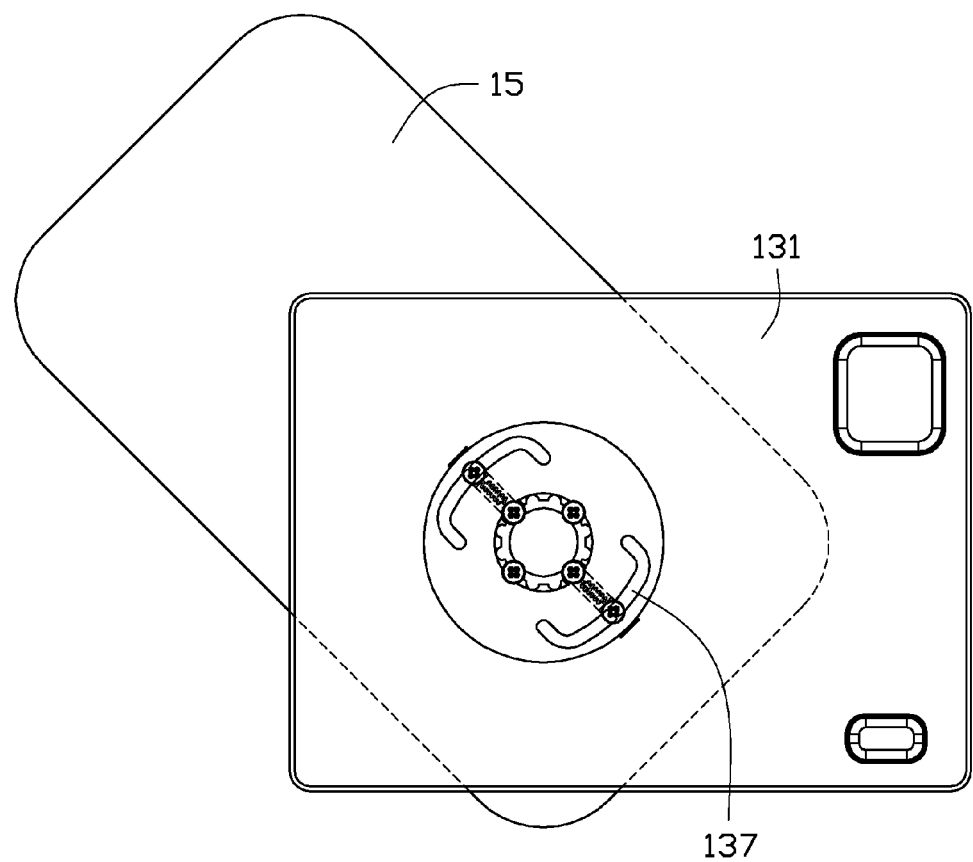
FIG. 11 shows a rotation of the first body to the second state from the first state.

Referring also to FIG. 7 and FIG. 8, in assembly of the first body 15 and the second body 10, the spindle 161 passes through the second through hole 181 of the flat washer 18 and the first through hole 133 of the top cover 131. The fixing poles 192 of four fixing members 19 are fixed into the spindle 161, and the heads 190 of the four fixing members 19 are blocked in the top cover 131 and thus preventing the release of the spindle 161 from the top cover 131. The spindle 161 of the first body 15 is rotatably received in the first through hole 133 and the second through hole 181. The first body 15 is rotatably attached to the second body 10.

The base bodies 140 of the sliding blocks 14 are movably received in the first receiving space 160 of the first casing 16, the limiting poles 142 of the sliding blocks 14 pass through the first sliding hole 162 of the first casing 16, the third sliding holes 182 of the flat washer 18, and the second sliding holes 134 of the top cover 131. The fixing poles 192 of the other two fixing members are fixed into the limiting poles 142 of the sliding blocks 14, and the heads 190 of the two fixing members 19 are blocked in the top cover 131 and prevent the release of the limiting poles 142 of the sliding blocks 14 from the top cover 131. The limiting poles 142 are movably received in the second sliding holes 134, the third sliding holes 182, and the first sliding holes 162.

The elastic members 17 are received in the first sliding holes 162. The elastic members 17 connect the sliding blocks 14 to the spindle 161, and exert a resilient force to the sliding blocks 14 when the sliding blocks 14 move back and forth along the direction parallel to the long axis 150 of the first body 15.

Figure 12:
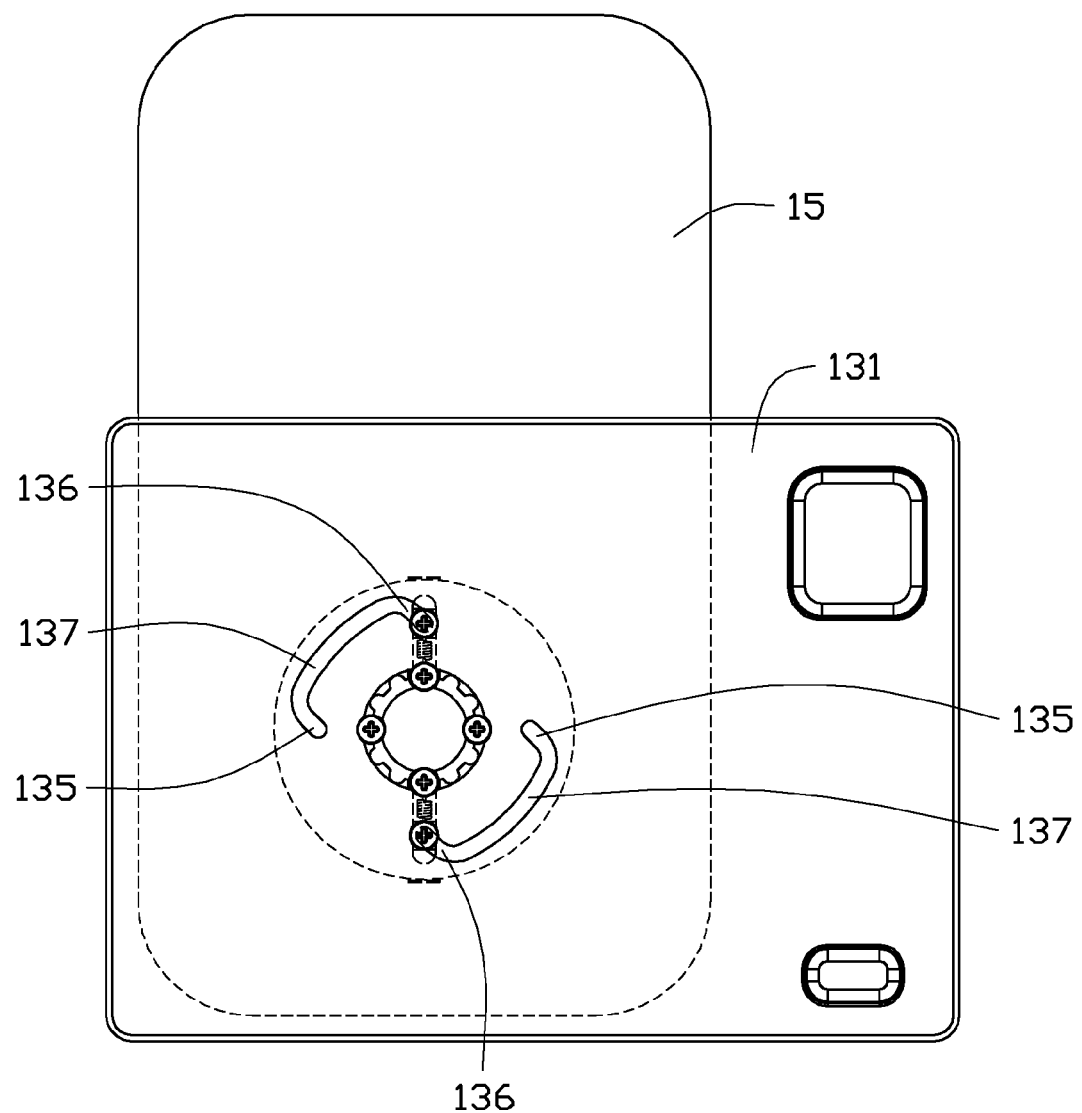
FIG. 12 shows the electronic device of FIG. 8 in the second state.

Referring also to FIG. 9-12, the electronic device 1 can be manipulated to be in a first state (see FIG. 9-10) or in a second state (see FIG. 12). When the electronic device 1 is in the first state, the long axis 150 of the first body 15 is parallel to the first direction, and the first sliding holes 162 and the third sliding holes 182 are parallel to the first direction, and the connecting lines between the center of the first through hole 133 and the first distal ends 138 of the second sliding holes 134 are parallel to the first direction. The limiting poles 142 of the sliding blocks 14 are located at the first distal ends 138 of the first portions 135 of the second sliding holes 134.

The electronic device 1 can be adjusted to be in a second state from the first state by exerting an external force to the first body 15 (see FIG. 11-12), whereby the first body 15 is rotated, and the long axis 150, the first sliding holes 162, and the third sliding holes 182 rotate in unison with the first body, and the directions of the long axis 150, the first sliding holes 162, and the third sliding holes 182 switch to be parallel to the second direction from the first direction. The sliding blocks 14 slide in the first sliding holes 162, the third sliding holes 182, and the second sliding holes 134, and the limiting poles 142 slide to the second distal ends 139 of the second sliding holes 134 from the first distal ends 138 of the second sliding holes 134. In the second state, the long axis 150 of the first body 15 is parallel to the second direction, and the first sliding holes 162 and the third sliding holes 182 are parallel to the second direction, the connecting lines between the center of the first through hole 133 and the second distal ends 139 of the second sliding holes 134 are parallel to the second direction. The limiting poles 142 of the sliding blocks 14 slide to the second distal ends 139 of the second sliding holes 134.

With the above-described configuration, the electronic device 1 utilizes a simple mechanism to enable the rotating function.

It is believed that the present embodiments and their advantages will be understood from the foregoing description, and it will be apparent that various changes may be made thereto without departing from the spirit and scope of the description or sacrificing all of their material advantages, the examples hereinbefore described merely being exemplary embodiments.

What is claimed is:

1. An electronic device, comprising:
   a first body comprising a first casing, the first casing comprising a spindle extending from a surface of the first casing, and defining a first sliding hole connected to the spindle;
   a second body comprising a second casing, the second casing defining a first through hole to rotatably receive the spindle and a second sliding hole outside the first through hole, the second sliding hole comprising a first distal end and a second distal end, a connecting line of a center of the first through hole and the first distal end being parallel to a first direction, and a connecting line of the center of the first through hole and the second distal end being parallel to a second direction; and
   a rotation mechanism connecting the first body to the second body, the rotation mechanism comprising a sliding block and an elastic member, the sliding block movably received both in the first sliding hole and the second sliding hole, and the elastic member connected the sliding block to the spindle and exerting resilient force to the sliding block when the sliding block moves in the first and second sliding holes;
   wherein the first body is rotatable relative to the second body via the rotating mechanism and switchable between a first state and a second state; and in the first state, the first sliding hole of the first casing is parallel to the first direction, and the sliding block is located at the first distal end of the second sliding hole; and in the second state, the first sliding hole rotates in unison with the first body to be parallel to the second direction from the first direction, and the sliding block slides to the second distal end of the second sliding hole from the first distal end.

2. The electronic device of claim 1, wherein the second direction is substantially perpendicular to the first direction.

3. The electronic device of claim 2, wherein the first casing defines another first sliding holes connected to the spindle, and the two first sliding holes are at opposite sides of the spindle; the second casing defines another second sliding holes, and the two second sliding holes are symmetrically arranged at outside of the first through hole; and the rotation mechanism further comprises another elastic member and another sliding block, and the two elastic member are received in the first sliding holes and connect the two sliding blocks to the spindle.

4. The electronic device of claim 3, wherein each sliding block comprises a base body and a limiting pole extending from the base body towards the second body of the electronic device, the base bodies of the sliding blocks are movably received in the first casing, and the limiting poles pass through the first sliding holes and the second sliding holes and movably received in the first and second sliding holes.

5. The electronic device of claim 4, wherein the rotation mechanism further comprises a plurality of fixing members, two fixing members fix the limiting poles movably received in the first and second sliding holes and prevent the release of the limiting poles from the second casing, and the other fixing members fix the spindle rotatably received in the first through hole and prevent the release of the spindle from the second casing.

6. The electronic device of claim 5, wherein the rotation mechanism further comprises a flat washer switched between the first and second casings, the flat washer defines a second through hole to rotatably receive the spindle and two third sliding holes at opposite sides of the second through holes, and the third sliding holes extend parallel to the first sliding holes and are configured to movably receive the limiting poles.

7. The electronic device of claim 1, wherein the spindle further comprises a plurality of semicircular protrusions extending from circumference of the spindle.

8. The electronic device of claim 1, wherein the spindle defines a receiving hole to allow wires which electrically interconnect the first body and the second body to pass through.

9. The electronic device of claim 2, wherein each second sliding hole comprises a first portion, a second portion, and a connection portion interconnecting the first and second portions, the first portion comprises the first distal end, and the second portion comprises the second distal end, an extending direction of the first portion is oblique to the first direction and forms a first angle, an extending direction of the second portion is oblique to the first direction and forms a second angle.

10. The electronic device of claim 9, wherein the first angle and the second angle are both forty-five degrees.

11. An electronic device, comprising:
a first body comprising a first casing, the first casing comprising a spindle extending from a rear of the first casing, and defining a first sliding hole connected to the spindle;
a second body comprising a second casing, the second casing defining a first through hole to rotatably receive the spindle and a second sliding hole outside the first through hole, the second sliding hole comprising a first distal end and a second distal end, a connecting line of a center of the first through hole and the first distal end being parallel to a first direction, a connecting line of the center of the first through hole and the second distal end being parallel to a second direction; and
a rotation mechanism connecting the first body to the second body, the rotation mechanism comprising a sliding block and an elastic member, the sliding block movably received both in the first sliding hole and the second sliding hole, and the elastic member connected the sliding block to the spindle and exerting resilient force to the sliding block when the sliding block moves in the first and second sliding holes;
wherein the first body is rotatable relative to the second body via the rotating mechanism, the first sliding hole rotate in unison with the first body, and a extending direction of the first sliding hole are switchable between a position parallel to the first direction and a position parallel to the second direction; and the sliding block moves and is switchable between a location at the first distal end of the second sliding hole and a location at the second distal end of the second sliding hole.

12. The electronic device of claim 11, wherein the second direction is substantially perpendicular to the first direction.

13. The electronic device of claim 12, wherein the first casing defines another first sliding holes connected to the spindle, and the two first sliding holes are at opposite sides of the spindle; the second casing defines another second sliding holes, and the two second sliding holes are symmetrically arranged at outside of the first through hole; and the rotation mechanism further comprises another elastic member and another sliding block, and the two elastic member are received in the first sliding holes and connect the two sliding blocks to the spindle.

14. The electronic device of claim 13, wherein each sliding block comprises a base body and a limiting pole extending from the base body towards the second body of the electronic device, the base bodies of the sliding blocks are movably received in the first casing, and the limiting poles pass through the first sliding holes and the second sliding holes and movably received in the first and second sliding holes.

15. The electronic device of claim 14, wherein the rotation mechanism further comprises a plurality of fixing members, two fixing members fix the limiting poles movably received in the first and second sliding holes and prevent the release of the limiting poles from the second casing, and the other fixing members fix the spindle rotatably received in the first through hole and prevent the release of the spindle from the second casing.

16. The electronic device of claim 15, wherein the rotation mechanism further comprises a flat washer switched between the first and second casings, the flat washer defines a second through hole to rotatably receive the spindle and two third sliding holes at opposite sides of the second through holes, and the third sliding holes extend parallel to the first sliding holes and are configured to movably receive the limiting poles.

17. The electronic device of claim 11, wherein the spindle further comprises a plurality of semicircular protrusions extending from circumference of the spindle.

18. The electronic device of claim 11, wherein the spindle defines a receiving hole to allow wires which electrically interconnect the first body and the second body to pass through.

19. The electronic device of claim 12, wherein each second sliding hole comprises a first portion, a second portion, and a connection portion interconnecting the first and second portions, the first portion comprises the first distal end, and the second portion comprises the second distal end, an extending direction of the first portion is oblique to the first direction and forms a first angle, an extending direction of the second portion is oblique to the first direction and forms a second angle.

20. The electronic device of claim 19, wherein the first angle and the second angle are both forty-five degrees.

* * * * *